(12) United States Patent
Park

(10) Patent No.: US 11,055,007 B2
(45) Date of Patent: Jul. 6, 2021

(54) DATA STORAGE DEVICE, OPERATION METHOD THEREOF AND STORAGE SYSTEM HAVING THE SAME

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 209 days.

(21) Appl. No.: 16/217,470

(22) Filed: Dec. 12, 2018

(65) Prior Publication Data

US 2020/0073573 A1 Mar. 5, 2020

(30) Foreign Application Priority Data

Aug. 30, 2018 (KR) .................. 10-2018-0102987

(51) Int. Cl.
  *G06F 3/06* (2006.01)
  *G06F 12/02* (2006.01)
  *G11C 29/00* (2006.01)
  *G11C 7/10* (2006.01)
  *G11C 8/12* (2006.01)

(52) U.S. Cl.
  CPC ............ *G06F 3/0644* (2013.01); *G06F 3/061* (2013.01); *G06F 3/064* (2013.01); *G06F 3/0659* (2013.01); *G06F 3/0679* (2013.01); *G06F 12/0246* (2013.01); *G11C 7/1042* (2013.01); *G11C 8/12* (2013.01); *G11C 29/70* (2013.01)

(58) Field of Classification Search
  None
  See application file for complete search history.

(56) References Cited

U.S. PATENT DOCUMENTS

| | | | | |
|---|---|---|---|---|
| 10,170,202 | B2* | 1/2019 | Iwai | G11C 29/52 |
| 2016/0077749 | A1* | 3/2016 | Ravimohan | G06F 3/0688 |
| | | | | 711/103 |
| 2018/0151251 | A1* | 5/2018 | Oh | G11C 29/76 |
| 2018/0173434 | A1* | 6/2018 | Li | G06F 13/4282 |

FOREIGN PATENT DOCUMENTS

| | | |
|---|---|---|
| KR | 1020170044780 | 4/2017 |
| KR | 1020170059658 | 5/2017 |

* cited by examiner

*Primary Examiner* — Ryan Bertram
*Assistant Examiner* — Edmund H Kwong
(74) *Attorney, Agent, or Firm* — IP & T Group LLP

(57) ABSTRACT

A data storage device may include: a storage configured as a group of a plurality of memory blocks; and a controller configured to: control data input/output of the storage according to a request transferred from a host device; configure one or more first block groups by grouping a preset number of memory blocks which are selected at the same time among the memory blocks during an operation of the storage; configure one or more second block groups by replacing a bad memory block of the respective first block groups with a spare memory block; manage as a special block group a second block group where the spare memory block having replaced the bad memory block is not present in the same plane of the bad memory block, among the second block groups; and write data having a preset property to the special block group.

21 Claims, 8 Drawing Sheets

REPLACEMENT MEMORY BLOCK

BAD MEMORY BLOCK

REPLACEMENT MEMORY BLOCK

DATA STORAGE DEVICE, OPERATION METHOD THEREOF AND STORAGE SYSTEM HAVING THE SAME

CROSS-REFERENCES TO RELATED APPLICATION

The present application claims priority under 35 U.S.C. § 119(a) to Korean application number 10-2018-0102987, filed on Aug. 30, 2018, in the Korean Intellectual Property Office, which is incorporated herein by reference in its entirety.

BACKGROUND

1. Technical Field

Various embodiments of the present invention generally relate to a semiconductor device. Particularly, the embodiments relate to a data storage device, an operation method thereof and a storage system including the same.

2. Related Art

A storage device is connected to a host device and performs a data input/output operation according to a request received from the host device. The storage device may use a variety of storage media to store data.

The storage device may include a device for storing data in a magnetic disk such as a hard disk drive (HDD) and a device for storing data in a semiconductor memory device such as a solid state drive (SSD) or memory card, or specifically a nonvolatile memory.

A flash memory-based storage medium includes advantages such as high capacity, nonvolatile property, low unit price, low power consumption, and high data processing speed.

According to the interleaving scheme, a group of independent memory regions are accessed at the same time for a speedy operation of a storage medium. In order for the storage medium to efficiently perform an operation according to the interleaving scheme, the group of memory regions needs to be well maintained.

SUMMARY

In an embodiment, a data storage device may include: a storage configured as a group of a plurality of memory blocks; and a controller configured to: control data input/output of the storage according to a request transferred from a host device; configure one or more first block groups by grouping a preset number of memory blocks which are selected at the same time among the memory blocks during an operation of the storage; configure one or more second block groups by replacing a bad memory block of the respective first block groups with a spare memory block; manage as a special block group a second block group where the spare memory block having replaced the bad memory block is not present in the same plane of the bad memory block, among the second block groups; and write data having a preset property to the special block group.

In an embodiment, a data storage device may include: a storage comprising one or more dies each including a plurality of planes, wherein each of the planes is configured as a group of a plurality of memory blocks; and a controller configured to: control data input/output of the storage according to a request transferred from a host device; configure one or more first block groups by grouping memory blocks each selected from each of the planes included in each of the one or more dies; configure one or more second block groups by replacing a bad memory block of the respective first block groups with a spare memory block; classify one or more second block groups, in which all memory blocks are not simultaneously selected among the second block groups during an operation of the storage, into special block groups; and write data having a preset property to the special block group.

In an embodiment, there is provided an operation method of a data storage device which includes a storage configured as a group of a plurality of memory blocks and a controller configured to control data input/output on the storage according to a request transferred from a host device. The operation method may include the steps of: configuring, by the controller, one or more first block groups by grouping a preset number of memory blocks which are selected at the same time among the memory blocks during an operation of the storage; configuring, by the controller, one or more second block groups by replacing a bad memory block of the respective first block groups with a spare memory block; configuring as a special block group, by the controller, a second block group where the spare memory block having replaced the bad memory block is not present in the same plane of the bad memory block, among the second block groups; and writing data having a preset property to the special block group in response to a write request.

In an embodiment, a storage system comprising: a host device; and a data storage device comprising a storage configured as a group of a plurality of memory blocks and a controller configured to control data input/output of the storage according to a request transferred from the host device, wherein the controller is further configured to: configure one or more first block groups by grouping a preset number of memory blocks which are to be selected at the same time among the memory blocks during an operation of the storage; configure one or more second block groups by replacing a bad memory block of the respective first block groups with a spare memory block; manage as a special block group a second block group where the spare memory block having replaced the bad memory block is not present in the same plane of the bad memory block, among the second block groups; and write data having a preset property to the special block group.

In an embodiment, a data storage device may include: a storage including a first block group configured by two or more memory blocks from respective planes, the storage performing an operation on the first block group according to an interleaving scheme; and a controller configured to control the storage to configure a second block group by replacing a bad memory block of the first block group with a spare memory block, and to write data into the second block group according to a scheme other than the interleaving scheme, wherein the bad memory block and the spare memory block are not included in the same plane.

DETAILED DESCRIPTION

Figure 1:
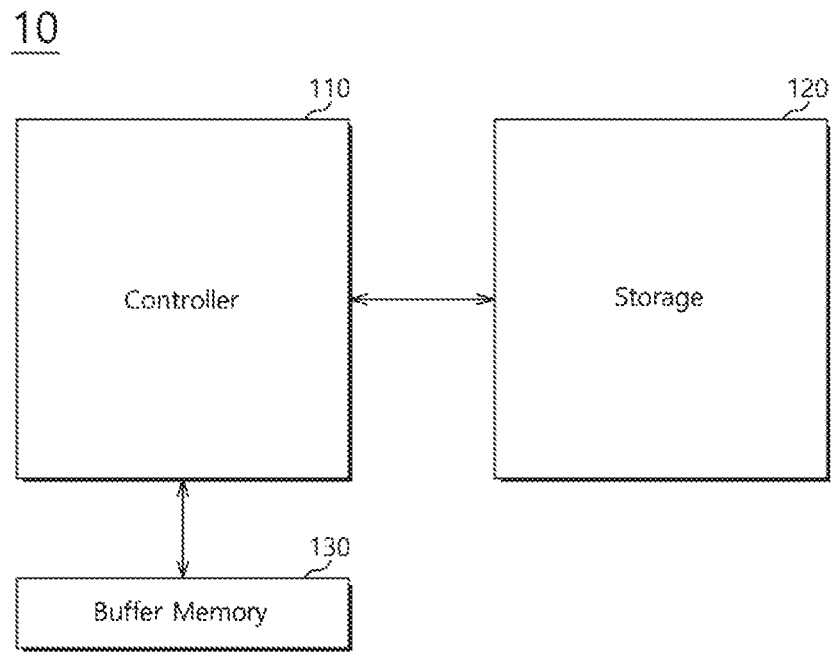
FIG. 1 is a configuration diagram illustrating a data storage device in accordance with an embodiment.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, a data storage device, an operation method thereof and a storage system having the same according to the present disclosure will be described below with reference to the accompanying drawings through exemplary embodiments.

FIG. 1 is a configuration diagram illustrating a data storage device 10 in accordance with an embodiment.

Referring to FIG. 1, the data storage device 10 in accordance with the present embodiment may include a controller 10, a storage 120 and a buffer memory 130.

The controller 110 may control the storage 120 in response to a request of a host device. For example, the controller 110 may program data to the storage 120 according to a program (write) request of the host device. Also, the controller 110 may provide data stored in the storage 120 to the host device in response to a read request of the host device. In an embodiment, the controller 110 may store a command or request transferred from the host device in a queue, and process the command according to a result obtained by scheduling the command.

The storage 120 may write data or output data written therein according to control of the controller 110. The storage 120 may be configured as a volatile or nonvolatile memory device. In an embodiment, the storage 120 may be implemented as a memory device selected from various nonvolatile memory devices such as an EEPROM (Electrically Erasable and Programmable ROM), NAND flash memory, NOR flash memory, PRAM (Phase-Change RAM), ReRAM (Resistive RAM), FRAM (Ferroelectric RAM) and STT-MRAM (Spin Torque Transfer Magnetic RAM). The storage 120 may include one or more dies. Each of the dies may include a plurality of planes. Each of the planes may include one or more memory blocks, and each of the memory blocks may have a hierarchy structure that includes one or more pages each including a plurality of memory cells. Read and write (program) operations may be performed on a page basis, for example, and an erase operation may be performed in a memory block basis, for example. In order to improve data input/output speed, the processing unit of read or written data may be determined according to the fabrication purpose of the data storage device 10. Furthermore, the storage 120 may include single-level cells each configured to store one-bit data or multi-level cells each configured to store multi-bit data.

The buffer memory 130 may serve as a space for temporarily storing data when the data storage device 10 performs a series of operations of writing or reading data while interworking with the host device. FIG. 1 illustrates that the buffer memory 130 is located outside the controller 110, but the buffer memory 130 may be located inside or outside the controller 110.

In an embodiment, the controller 110 may group a plurality of memory blocks according to a preset policy, and manage the grouped memory blocks as "block group". The memory blocks included in the block group may be selected substantially at the same time through an interleaving scheme, for example, a channel interleaving scheme, a die interleaving scheme or a chip interleaving scheme.

Data which are written to the storage 120 at a time according to a write request of the host device or an internal write command of the data storage device 10 may be referred to as "a chunk". The size of the chunk may depend on a request of the host device or the type of the data to be written to the storage 120.

As the controller 110 manages the storage 120 by units of the block groups, chunk data equal to or larger than a preset size may be simultaneously written to each block group having a plurality of memory blocks which can be selected at the same time, and chuck data may be read from each block group having the plurality of memory blocks which can be simultaneously selected.

Memory cells constituting the storage 120 may have a limited lifetime, and not normally operate due to various reasons in operation. Furthermore, a memory block including such memory cells may become "a bad memory block".

Since memory blocks are grouped into a block group so as to be selected at the same time, the corresponding block group may not normally operate when any one of the memory blocks is classified into a bad memory block.

The controller 110 may reconfigure a block group including a bad memory block by replacing the bad memory block of the block group with a spare memory block, such that the block group can be accessed as a logically normal block group.

In an embodiment, the controller 110 may configure a block group by selecting memory blocks at the same location or at different locations in the respective planes of each die and grouping the selected memory blocks, in order to operate the storage 120 according to the die interleaving scheme. When a bad memory block occurs in a block group, a replacement memory block to replace the bad memory block may be selected from the same or different die of the bad memory block or the same or different plane of the bad memory block. If the replacement memory block is selected from the same plane within the same die of the bad memory block, the corresponding block group can still operate according to the die interleaving scheme. However, when the replacement memory block is selected from a different plane in the same die of the bad memory block or a different die of the bad memory block, the corresponding block group cannot operate according to the interleaving scheme.

When a block group cannot operate according to the interleaving scheme, it may indicate that the plurality of memory blocks included in the block group cannot be accessed at the same time.

Therefore, for the storage 120 including one or more dies, the controller 110 in accordance with the present embodiment may configure one or more first block groups by selecting one memory block from each of the planes included in each die and grouping the selected memory blocks. Also, the controller 110 may configure one or more second block groups by selecting one or more memory blocks from some of the planes included in each die and grouping the selected memory blocks.

From another point of view, the controller 110 may configure and manage a first block group or a normal block group by grouping memory blocks at the same or different locations within the respective planes in the respective dies.

When at least one of the memory blocks included in the first block group or the normal block group becomes a bad memory block, the controller 110 may replace the bad memory block with a spare memory block (i.e., a replacement memory block), and configure a second block group as a reconfigured block group. In this case, when the replacement memory block is not located in the same plane within the same die of the bad memory block, the second block group or the reconfigured block group may not operate according to the interleaving scheme.

In an embodiment, the controller 110 may manage information (e.g. address) of the second block group or the reconfigured block group as a special block group in a separate memory block pool. The second block group as a special block group may indicate a reconfigured block group where a replacement memory block having replaced a bad memory block is not present in the same plane within the same die of the bad memory block, among the second block groups. Furthermore, the controller 110 may write data having a preset property among write target data to the special block group.

From another point of view, the controller 110 may manage a block group in which the configuring memory blocks cannot be simultaneously selected among the block groups, as a special block group. In response to a write request for data having the preset property, the controller 110 may write the corresponding data to the special block group.

Figure 2:
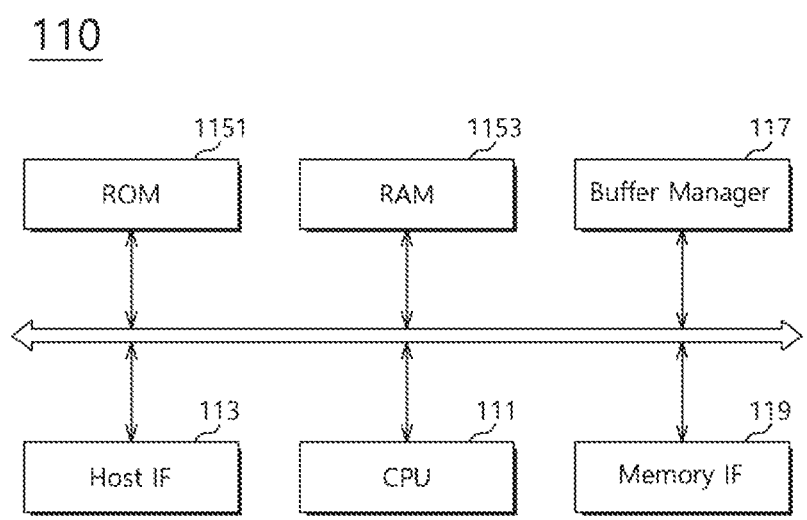
FIG. 2 is a configuration diagram illustrating a controller in accordance with the present embodiment.

FIG. 2 is a configuration diagram illustrating the controller 110 in accordance with the present embodiment.

Referring to FIG. 2, the controller 110 in accordance with the present embodiment may include a CPU 111, a host interface 113, a ROM 1151, a RAM 1153, a buffer manager 117 and a memory interface 119.

The CPU 111 may be configured to transfer various pieces of control information to the host interface 113, the RAM 1153 and the memory interface 119, the various pieces of control information being required for reading or writing data from or to the storage 120. In an embodiment, the CPU 111 may operate according to firmware which is provided for various operations of the data storage device 10. In an embodiment, the CPU 111 may perform a function of a flash translation layer (FTL) for performing garbage collection, address mapping or wear leveling to manage the storage 120 and a function of detecting and correcting an error of data read from the storage 120.

The host interface 113 may provide a communication channel for receiving a command and clock signal from the host device and controlling data input/output, according to control of the CPU 111. In particular, the host interface 113 may provide a physical connection between the host device and the data storage device 10. Furthermore, the host interface 113 may provide an interface with the data storage device 10 according to the bus format of the host device. The bus format of the host device may include one or more of standard interface protocols such as secure digital, USB (Universal Serial Bus), MMC (Multi-Media Card), eMMC (Embedded MMC), PCMCIA (Personal Computer Memory Card International Association), PATA (Parallel Advanced Technology Attachment), SATA (Serial Advanced Technology Attachment), SCSI (Small Computer System Interface), SAS (Serial Attached SCSI), PCI (Peripheral Component Interconnection), PCI-E (PCI Express) and UFS (Universal Flash Storage).

The ROM 1151 may store program codes required for an operation of the controller 110, for example, firmware or software. Furthermore, the ROM 1151 may store code data used by the program codes.

The RAM 1153 may store data required for the operation of the controller 110 or data generated by the controller 110.

The buffer manager 117 may be configured to manage the use states of the buffer memory 130.

The memory interface 119 may provide a communication channel for transmitting/receiving signals between the controller 110 and the storage 120. The memory interface 119 may write data to the storage 120 according to control of the CPU 111, the data being temporarily stored in the buffer memory. Furthermore, the memory interface 119 may transfer data read from the storage 120 to the buffer memory to temporarily store the data.

Figure 3:
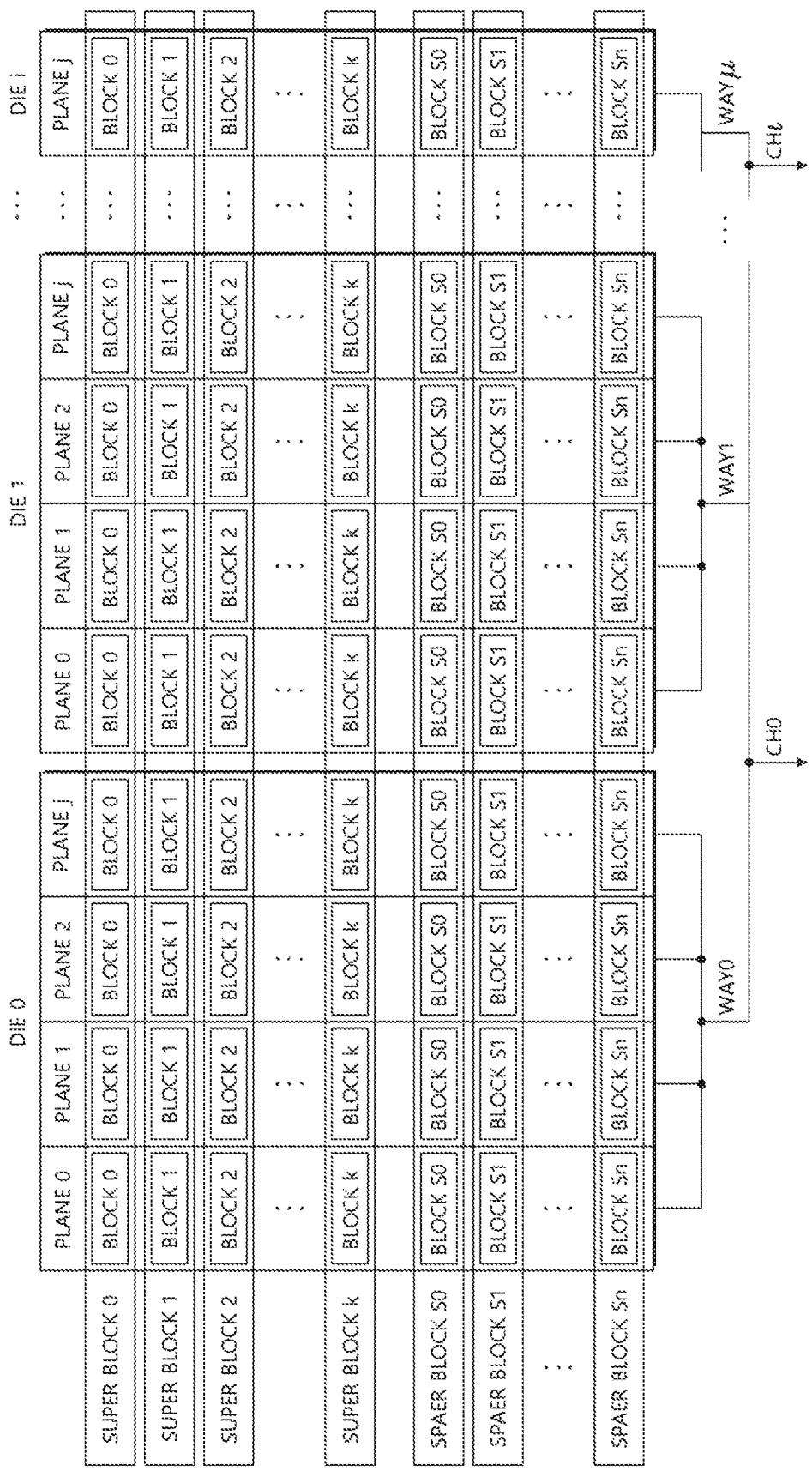
FIGS. 3 to 5 are diagrams for describing a concept of managing a storage in accordance with the present embodiment.
Figure 4:
Figure 5:
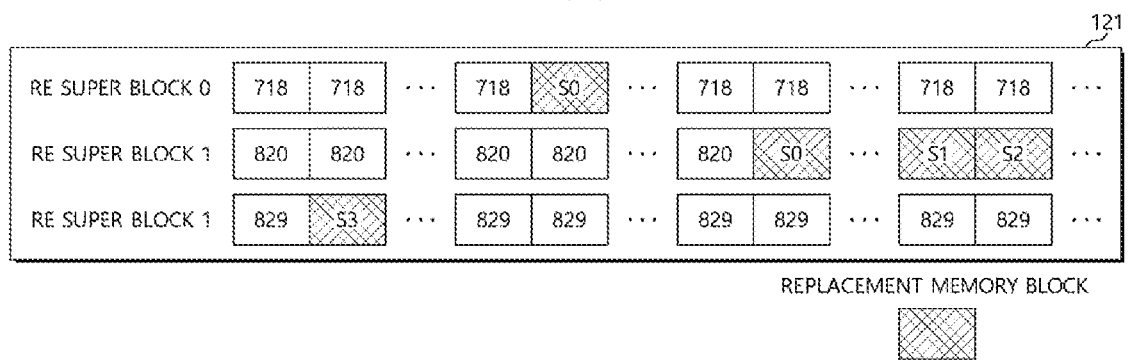

FIGS. 3 to 5 are diagrams for describing a concept of managing the storage 120 in accordance with the present embodiment.

Referring to FIG. 3, the storage 120 may include a plurality of dies DIE 0 to DIE i. Each of the dies DIE 0 to DIE i may include a plurality of planes PLANE 0 to PLANE j. The controller 110 may configure block groups SUPER BLOCK 0 to SUPER BLOCK k by selecting and grouping memory blocks at the same or different locations in the respective planes PLANE 0 to PLANE j. The storage 120 may include spare memory blocks SPARE BLOCKS 0 to SPARE BLOCKS n which are not included in the block groups SUPER BLOCK 0 to SUPER BLOCK k.

The plurality of planes PLANE 0 to PLANE j included in the plurality of dies DIE 0 to DIE i may input/output data through l channels CH0 to CHl and m ways WAY0 to WAYm. That is, FIG. 3 illustrates that one channel is shared by (i/l) ways, and one way is shared by j planes.

The controller 110 may group a plurality of memory blocks according to a preset policy, and manage the grouped memory blocks as "a block group". For example, memory blocks included in one block group may be selected substantially at the same time during an operation of the storage 120 according to the die interleaving scheme.

In an embodiment, the controller 110 may configure a block group by selecting memory blocks at the same location or at different locations in the respective planes of each die and grouping the selected memory blocks, in order to operate the storage 120 according to the die interleaving scheme.

Therefore, for the storage 120 including one or more dies, the controller 110 in accordance with the present embodiment may configure one or more first block groups or normal block groups by selecting one memory block from each of the planes included in each die and grouping the selected memory blocks.

When a bad memory block occurs in the first block group of the storage 120, the corresponding block group may not normally operate.

Referring to FIG. 4, the reason will be described as follows.

For example, among memory blocks included in a block group SUPER BLOCK 718, the memory block of the first plane PLANE 1 in the first die DIE 1 may become a bad memory block. Similarly, among memory blocks included in a block group SUPER BLOCK 820, the memory block of the first plane PLANE 1 in the third die DIE 3 and the memory blocks of the zeroth plane PLANE 0 and the first plane PLANE 1 in the fourth die DIE 4 may become bad memory blocks. Furthermore, among memory blocks included in a block group SUPER BLOCK 829, the memory block of the first plane PLANE 1 in the zeroth die DIE 0 may become a bad memory block.

Therefore, the controller 110 may configure one or more second block groups by grouping one or more memory blocks selected from some of the planes included in each of the dies.

In other words, when at least one of the memory blocks included in the first block group or the normal block group becomes a bad memory block, the controller 110 may replace the bad memory block with a spare memory block or a replacement memory block, and configure a second block group or a reconfigured block group. In this case, when the replacement memory block is not located in the same plane within the same die of the bad memory block, the second block group or the reconfigured block group may not operate according to the interleaving scheme.

In an embodiment, the controller 110 may manage a second block group or the reconfigured block group as "a special block group" in a separate memory block pool, the second block group indicating a reconfigured group where a replacement memory block having replaced a bad memory block is not present in the same plane within the same die of the bad memory block, among the second block groups. Furthermore, the controller 110 may write data having a preset property among write target data to the special block group.

From another point of view, the controller 110 may manage a block group which cannot be simultaneously selected among the block groups during an operation of the storage 120 according to the die interleaving scheme, as a special block group. In response to a write request for data having the preset property, the controller 110 may write the corresponding data to the special block group.

Referring to FIG. 4, the controller 110 may reconfigure the block groups by replacing the bad memory blocks of the first block groups SUPER BLOCK 718, SUPER BLOCK 820 and SUPER BLOCK 829 with spare memory blocks, such that the first block groups can be accessed as logically normal block groups. Then, the controller 110 may manage the reconfigured block groups as the second block groups.

Referring to FIG. 5, the controller 110 may replace the bad memory block of the block group SUPER BLOCK 718 with a spare memory block S0, replace the bad memory blocks of the block group SUPER BLOCK 820 with spare memory blocks S0, S1 and S2, and replace the bad memory block of the block group SUPER BLOCK 829 with a spare memory block S3.

Thanks to the replacement, the first block groups SUPER BLOCK 718, 820 and 829 may become the second block groups or the reconfigured block groups RE SUPER BLOCK 0 to 2. The controller 110 may manage the second block groups or the reconfigured block groups RE SUPER BLOCK 0 to 2 as special block groups in a separate memory block pool 121, the second block groups indicating reconfigured block groups where replacement memory blocks having replaced bad memory blocks are not present in the same plane within the same die of the bad memory blocks, among the second block groups. Furthermore, the controller 110 may write data having the preset property among write target data to the special block groups.

The memory block pool 121 illustrated in FIG. 5 may indicate a logical configuration of the special block groups.

In an embodiment, the data having the preset property may correspond to any one of the following data, but are not limited thereto.

1. Random data (target data of the current write operation corresponding to a logical block address which is not consecutive to a logical block address corresponding to the previous write operation).
2. Data having a size equal to or less than a preset size.
3. System data (for example, map data).
4. Single level cell (SLC) data.

The exemplified data are not required to be consecutively written for a rapid operation or have a small chunk size. That is, although those types of data are not written to memory cells which are simultaneously selected according to the interleaving scheme, the processing speed is not reduced.

Therefore, in the present embodiment, the data having the preset property may be written to a block group classified into the special block group, which makes it possible to maximize the utilization efficiency of the special block group.

A write request may be issued by the host device or the data storage device 10 itself. The write request issued by the host device may include a request for writing user data, for example.

The write request issued by the data storage device 10 itself may include a write request accompanied by garbage collection or wear leveling.

In the present embodiment, when data corresponding to a write request has the preset property, the write data may be stored in the special block group, regardless of which device issues the write request.

Figure 6:
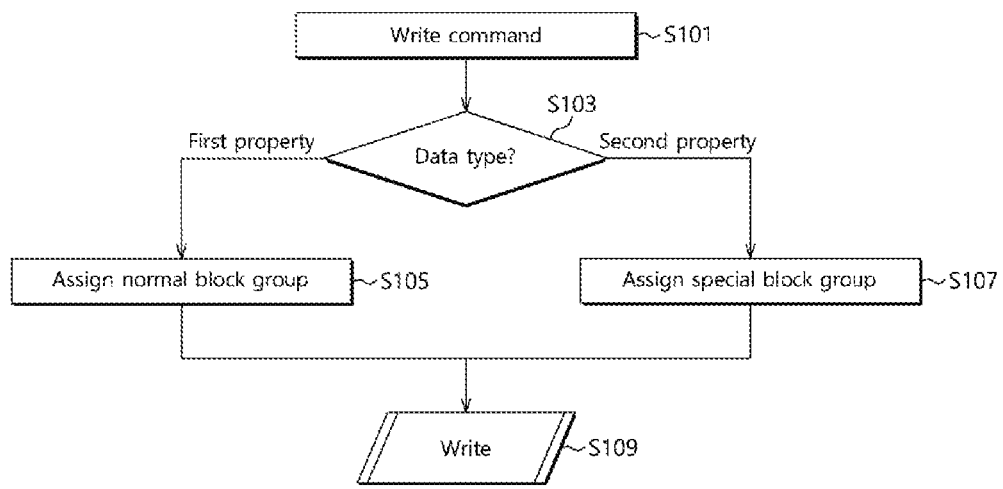
FIG. 6 is a flowchart illustrating an operation method of a data storage device in accordance with an embodiment.

FIG. 6 is a flowchart illustrating an operation method of the data storage device 10 in accordance with an embodiment. FIG. 6 shows an example in which the data storage device 10 stores data in response to a write request of a host device.

Referring to FIG. 6, a write command and write target data corresponding to the write command may be provided to the data storage device 10 at step S101.

The controller 110 may determine the property of the data to be written at step S103. When the property of the data is not a preset property, i.e. the property of the data is a first property, the controller 110 may assign a first block group, i.e. a normal block group at step S105, and write data having the first property to the assigned normal block group at step S109.

On the other hand, when the property of the data to be written is the preset second property, the controller 110 may assign a special block group of the second block groups or the reconfigured block groups at step S107, and write data having the second property to the assigned special block group at step S109.

In an embodiment, the data having the second property may include random data, data having a size equal to or less than a preset size, system data (for example, map data) and SLC data, but are not limited thereto.

Figure 7:
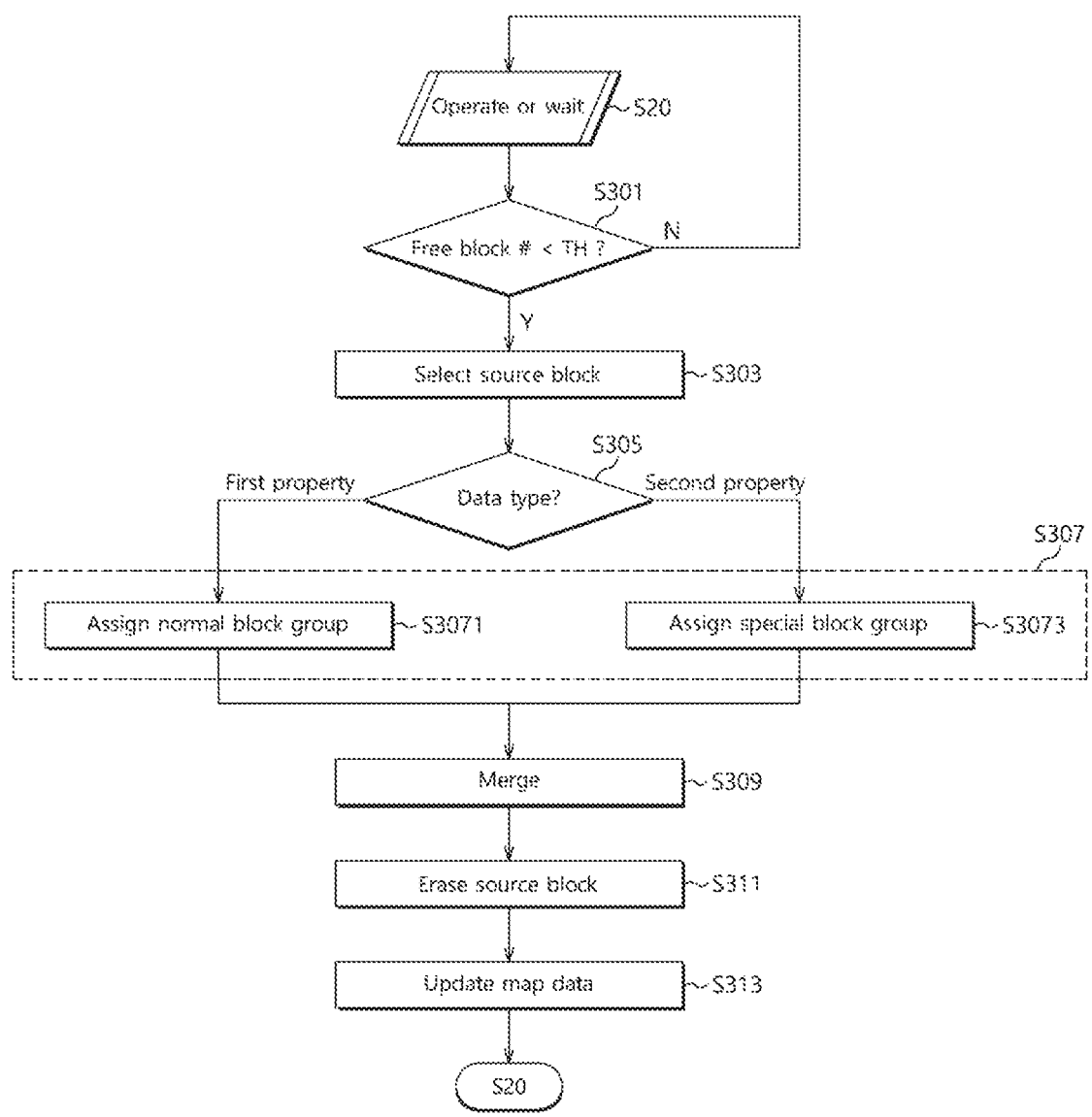
FIG. 7 is a flowchart illustrating an operation method of a data storage device in accordance with an embodiment.

FIG. 7 is a flowchart illustrating an operation method of the data storage device 10 in accordance with an embodiment. FIG. 7 shows an example of a garbage collection operation.

Referring to FIG. 7, the controller 110 may periodically check whether the number of free memory blocks within the storage 120 is equal to or more than a threshold value TH at step S20. When the number of free memory blocks within the storage 120 is equal to or more than a threshold value TH at step S20 ("N" at step S301), step S20 may be performed during an operation or standby mode of the data storage device 10.

When the number of free memory blocks is less than the threshold value TH ("Y" at step S301), the controller 110 may select a source memory block to perform a memory block merging operation at step S303.

The source memory block may indicate a memory block which is to be erased as a result of garbage collection, for example. The source memory block may be selected according to a preset policy for the memory block merging operation. For example, the source memory block may be selected in ascending order of a number of valid data or descending order of a number of invalid data among memory blocks.

Then, the controller 110 may determine the property of valid data in the selected source memory block at step S305. The controller 110 may assign a destination memory block based on the property of the data, at step S307.

When it is determined at step S305 that the property of the valid data is not the preset property, i.e. the property of the data is a first property, the controller 110 may assign a first block group, i.e. a normal block group at step S3071. When the property of the valid data to be copied into the destination memory block is the second property, the controller 110 may assign a special block group among the second block groups or the reconfigured block groups at step S3073.

In an embodiment, the data having the second property may include random data, data having a size equal to or less than the preset size, system data (for example, map data) and SLC data, but are not limited thereto.

When the destination memory block is assigned, the controller 110 may merge the valid data into the assigned destination memory block at step S309. Now, the source memory block may be erased at step S311, and a map table may be updated at step S313.

Figure 8:
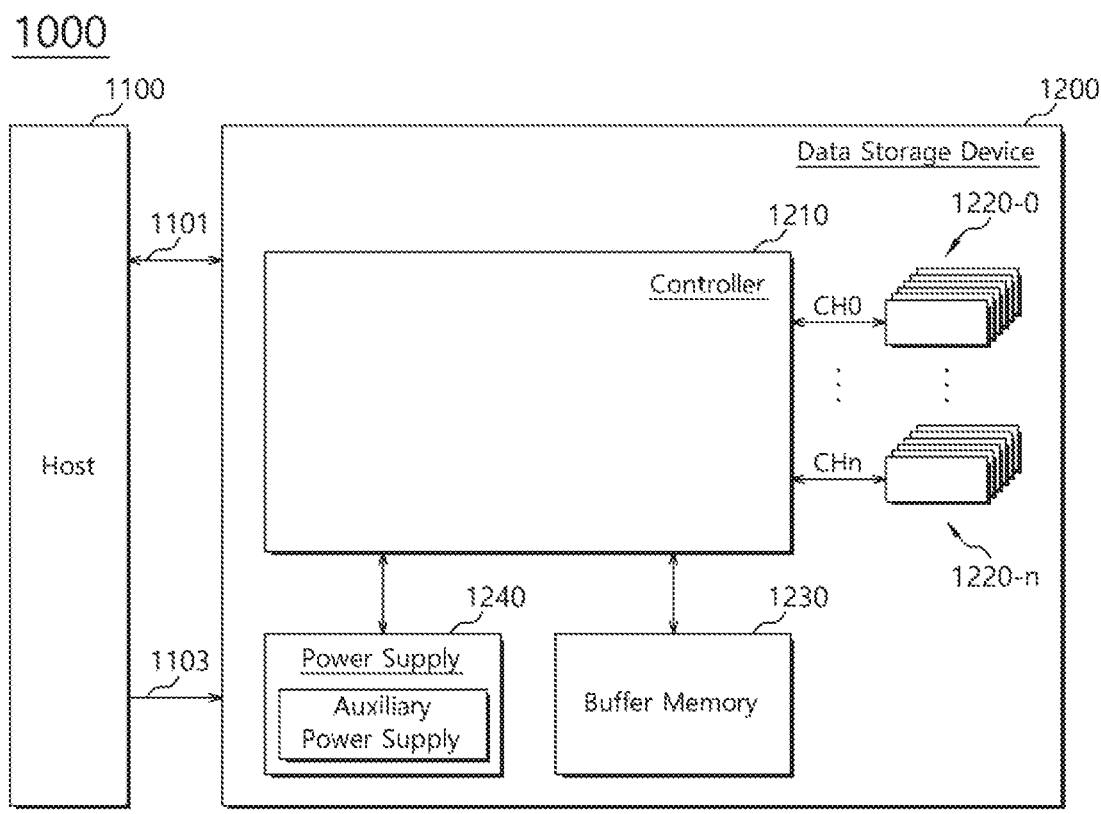
FIG. 8 is a diagram illustrating a data storage system in accordance with an embodiment.

FIG. 8 is a diagram illustrating a data storage system in accordance with an embodiment.

Referring to FIG. 8, the data storage 1000 may include a host device 1100 and the data storage device 1200. In an embodiment, the data storage device 1200 may be configured to a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface unit, a control unit, a random access memory used as a working memory, an error correction code (ECC) unit, and a memory interface unit. In an embodiment, the controller 1210 may configured by controller 110 as shown is FIG. 1 to FIG. 2.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to a firmware or a software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103, to the inside of the data storage device 1200. The power supply 1240 may include an auxiliary power supply. The auxiliary power supply may supply power to allow the data storage device 1200 to be normally terminated when a sudden power-off occurs. The auxiliary power supply may include large capacity capacitors.

The signal connector 1101 may be configured by various types of connectors depending on an interface scheme between the host device 1100 and the data storage device 1200.

The power connector 1103 may be configured by various types of connectors depending on a power supply scheme of the host device 1100.

Figure 9:
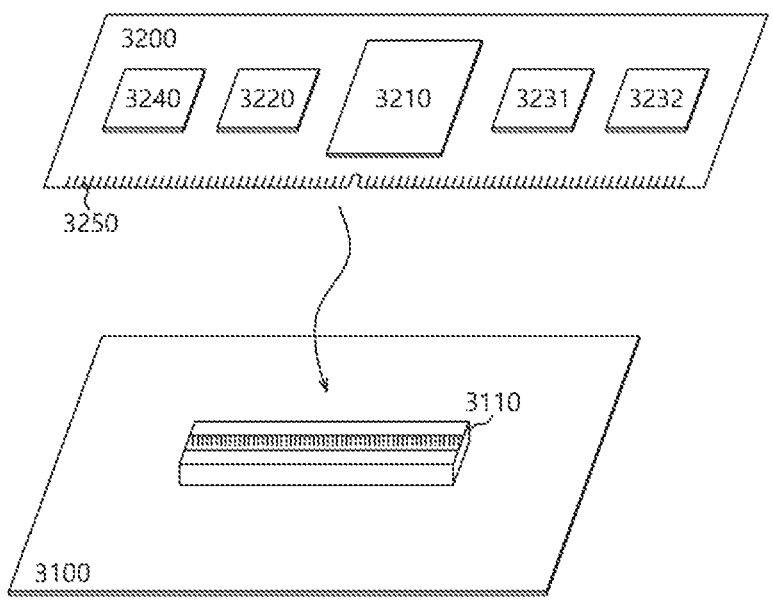
FIG. 9 and FIG. 10 are diagrams illustrating a data processing system in accordance with an embodiment.

FIG. 9 is a diagram illustrating a data processing system in accordance with an embodiment. Referring to FIG. 9, the data processing system 3000 may include a host device 3100 and the memory system 3200.

The host device 3100 may be configured in the form of a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 as shown in FIGS. 1 to 2.

The buffer memory device 3220 may temporarily store data to be stored in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data and so forth and power may be transferred between the host device 3100 and the memory system 3200. The connection terminal 3250 may be configured into various types depending on an interface scheme between the host device 3100 and the memory system 3200. The connection terminal 3250 may be disposed on any one side of the memory system 3200.

Figure 10:
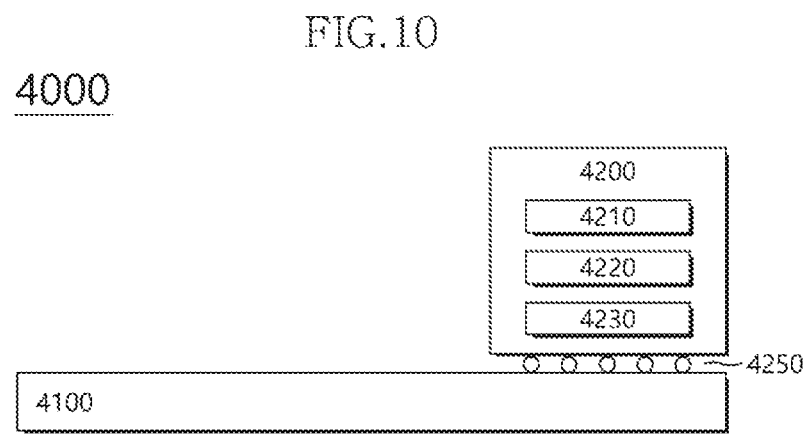

FIG. 10 is a diagrams illustrating a data processing system in accordance with an embodiment. Referring to FIG. 10, the data processing system 4000 may include a host device 4100 and the memory system 4200.

The host device 4100 may be configured in the form of a board such as a printed circuit board. Although not shown, the host device 4100 may include internal function blocks for performing the function of a host device.

The memory system 4200 may be configured in the form of a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 as shown in FIGS. 1 to 2.

The buffer memory device 4220 may temporarily store data to be stored in the nonvolatile memory device 4230. Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 11:
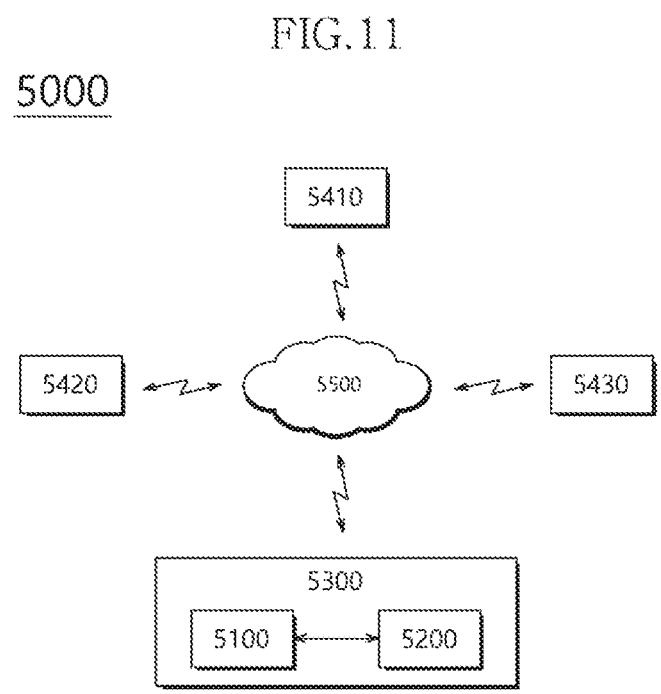
FIG. 11 is a diagram illustrating a network system including a data storage device in accordance with an embodiment.

FIG. 11 is a diagram illustrating a network system including a data storage device in accordance with an embodiment. Referring to FIG. 11, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430. For another example, the server system 5300 may provide data to the plurality of client systems 5410 to 5430.

The server system 5300 may include a host device 5100 and the memory system 5200. The memory system 5200 may be configured by the memory system 10 shown in FIG. 1, the data storage device 1200 shown in FIG. 8, the memory system 3200 shown in FIG. 9 or the memory system 4200 shown in FIG. 10.

Figure 12:
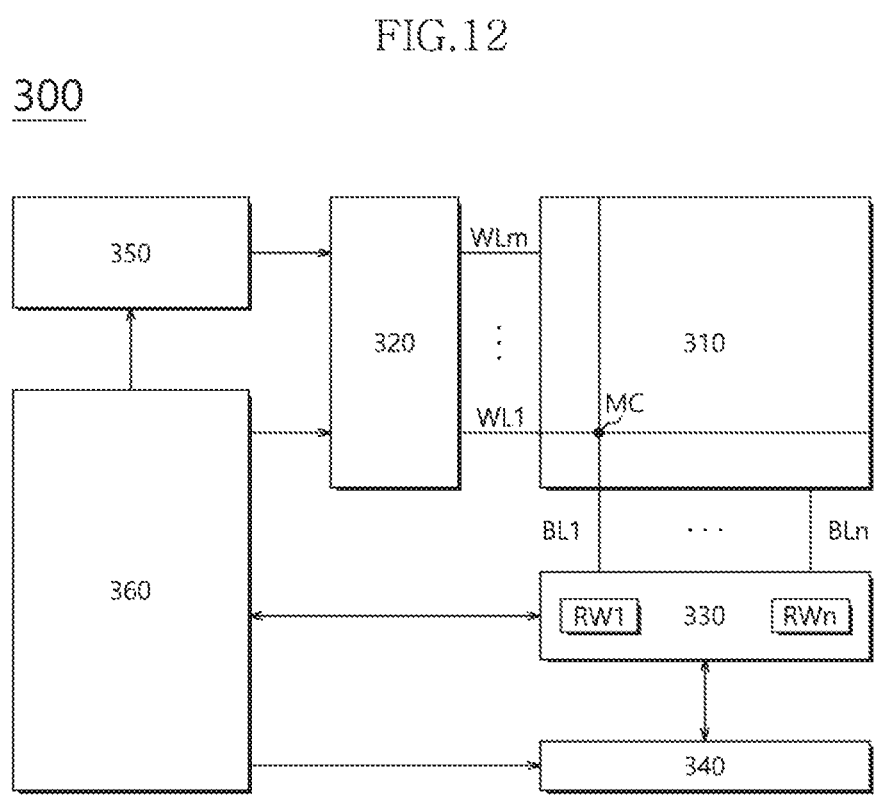
FIG. 12 is a block diagram illustrating a nonvolatile memory device included in a data storage device in accordance with an embodiment.

FIG. 12 is a block diagram illustrating a nonvolatile memory device included in a data storage device in accordance with an embodiment. Referring to FIG. 12, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array has a direction perpendicular to the flat surface of a semiconductor substrate. Moreover, the three-dimensional memory array means a structure including NAND strings which at least memory cell is located in a vertical upper portion of the other memory cell.

The structure of the three-dimensional memory array is not limited thereto. It is apparent that the memory array structure can be selectively applied to a memory array structure formed in a highly integrated manner with horizontal directionality as well as vertical directionality.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device, the operating method thereof and the storage system including the same described herein should not be limited based on the described embodiments.

While various embodiments have been described above, it will be understood to those skilled in the art that the embodiments described are examples only. Accordingly, the operating method of a data storage device described herein should not be limited based on the described embodiments.

What is claimed is:

1. A data storage device comprising:
a storage configured as a group of a plurality of memory blocks; and
a controller configured to:
control data input/output of the storage according to a request transferred from a host device;
configure one or more first block groups by grouping a preset number of memory blocks which are selected at the same time among the memory blocks during an operation of the storage;
configure one or more second block groups by replacing a bad memory block of the respective first block groups with a spare memory block;
manage as a special block group a second block group where the spare memory block having replaced the bad memory block is not present in the same plane of the bad memory block, among the second block groups; and
write data having a preset property to the special block group.

2. The data storage device according to claim 1, wherein the storage comprises one or more dies each including a plurality of planes having the plurality of memory blocks, and
wherein the controller configures the first block group by grouping memory blocks at the same or different locations within the respective planes.

3. The data storage device according to claim 2, wherein the special block group comprises one or more second block groups where the spare memory block having replaced the bad memory block is not present in the same plane within the same die of the bad memory block.

4. The data storage device according to claim 1, wherein the data having the preset property comprises any one or more of random data, data having a size equal to or less than a preset size, system data and single level cell (SLC) data.

5. The data storage device according to claim 1, wherein the controller manages information of the special block group in a separate block pool.

6. A data storage device comprising:
a storage comprising one or more dies each including a plurality of planes, wherein each of the planes is configured as a group of a plurality of memory blocks; and
a controller configured to:
control data input/output of the storage according to a request transferred from a host device;
configure one or more first block groups by grouping memory blocks each selected from each of the planes included in each of the one or more dies;
configure one or more second block groups by replacing a bad memory block of the respective first block groups with a spare memory block;
classify one or more second block groups, in which all memory blocks are not simultaneously selected among the second block groups during an operation of the storage, into special block groups; and
write data having a preset property to the special block group.

7. The data storage device according to claim 6, wherein the controller configures the special block groups by replacing the bad memory block of the respective first block group with the spare memory block located in a different plane within the same die of the bad memory block or a different die of the bad memory block.

8. The data storage device according to claim 6, wherein the controller configures the first block groups by grouping memory blocks at the same or different locations within the respective planes.

9. The data storage device according to claim 6, wherein the data having the preset property comprises one or more of random data, data having a size equal to or less than a preset size, system data and SLC data.

10. The data storage device according to claim 6, wherein the controller manages information of the special block group in a separate block pool.

11. An operation method of a data storage device which includes a storage configured as a group of a plurality of memory blocks and a controller configured to control data input/output of the storage according to a request transferred from a host device, the operation method comprising the steps of:
   configuring, by the controller, one or more first block groups by grouping a preset number of memory blocks which are selected at the same time among the memory blocks during an operation of the storage;
   configuring, by the controller, one or more second block groups by replacing a bad memory block of the respective first block groups with a spare memory block;
   configuring as a special block group, by the controller, a second block group where the spare memory block having replaced the bad memory block is not present in the same plane of the bad memory block, among the second block groups; and
   writing data having a preset property to the special block group in response to a write request.

12. The operation method according to claim 11,
   wherein the storage comprises one or more dies each including a plurality of planes having the plurality of memory blocks, and
   wherein the step of constituting the one or more first block groups includes grouping, by the controller, memory blocks at the same or different locations within the respective planes.

13. The operation method according to claim 12, wherein the step of constituting the second block group as the special group comprises classifying into the special block group one or more second block groups where the spare memory block having replaced the bad memory block is not present in the same plane within the same die of the bad memory block.

14. The operation method according to claim 11, wherein the data having the preset property comprises any one or more of random data, data having a size equal to or less than a preset size, system data and SLC data.

15. The operation method according to claim 11, wherein the step of constituting the second block group as the special group further comprises managing information of the special block group in a separate block pool.

16. A storage system comprising:
   a host device; and
   a data storage device comprising a storage configured as a group of a plurality of memory blocks and a controller configured to control data input/output of the storage according to a request transferred from the host device,
   wherein the controller is further configured to:
      configure one or more first block groups by grouping a preset number of memory blocks which are to be selected at the same time among the memory blocks during an operation of the storage;
      configure one or more second block groups by replacing a bad memory block of the respective first block groups with a spare memory block;
      manage as a special block group a second block group where the spare memory block having replaced the bad memory block is not present in the same plane of the bad memory block, among the second block groups; and
      write data having a preset property to the special block group.

17. The storage system according to claim 16,
   wherein the storage comprises one or more dies each including a plurality of planes having the plurality of memory blocks, and
   wherein the controller configures the first block group by grouping memory blocks at the same or different locations within the respective planes.

18. The storage system according to claim 17, wherein the special block group comprises one or more second block groups where the spare memory block having replaced the bad memory block is not present in the same plane within the same die of the bad memory block.

19. The storage system according to claim 18, wherein the data having the preset property comprises any one or more of random data, data having a size equal to or less than a preset size, system data and SLC data.

20. The storage system according to claim 16, wherein the controller manages information of the special block group in a separate block pool.

21. A data storage device comprising:
   a storage including a first block group configured by two or more memory blocks from respective planes, the storage performing an operation on the first block group according to an interleaving scheme; and
   a controller configured to control the storage to configure a second block group by replacing a bad memory block of the first block group with a spare memory block, and to write data into the second block group according to a scheme other than the interleaving scheme,
   wherein the bad memory block and the spare memory block are not included in the same plane.

* * * * *